(12) United States Patent
Wu et al.

(10) Patent No.: US 9,018,033 B2
(45) Date of Patent: Apr. 28, 2015

(54) METHOD FOR FORMING DIFFUSION REGIONS IN A SILICON SUBSTRATE

(71) Applicants: Kahn C. Wu, San Francisco, CA (US); Steven M. Kraft, Albany, CA (US); Paul Loscutoff, Castro Valley, CA (US); Steven Edward Molesa, San Jose, CA (US)

(72) Inventors: Kahn C. Wu, San Francisco, CA (US); Steven M. Kraft, Albany, CA (US); Paul Loscutoff, Castro Valley, CA (US); Steven Edward Molesa, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/061,422

(22) Filed: Oct. 23, 2013

(65) Prior Publication Data
US 2014/0048133 A1 Feb. 20, 2014

Related U.S. Application Data

(62) Division of application No. 13/250,594, filed on Sep. 30, 2011, now Pat. No. 8,586,397.

(51) Int. Cl.
*H01L 21/00* (2006.01)
*H01L 31/18* (2006.01)
*H01L 31/028* (2006.01)

(52) U.S. Cl.
CPC ............ *H01L 31/182* (2013.01); *H01L 31/028* (2013.01); *Y02E 10/546* (2013.01)

(58) Field of Classification Search
CPC ...................... H01L 31/186; H01L 31/022425; H01L 31/02167; H01L 31/173; H01L 23/532; H01L 31/0288; H01L 31/1872

USPC .................. 438/57, 97; 257/E31.13; 136/258
See application file for complete search history.

(56) References Cited

U.S. PATENT DOCUMENTS

| | | | |
|---|---|---|---|
| 4,283,589 | A | 8/1981 | Kaplow et al. |
| 4,473,523 | A | 9/1984 | Sasaki et al. |
| 4,927,770 | A | 5/1990 | Swanson |
| 5,030,295 | A | 7/1991 | Swanson et al. |
| 5,053,083 | A | 10/1991 | Sinton |

(Continued)

FOREIGN PATENT DOCUMENTS

| | | |
|---|---|---|
| JP | 2007134655 | 5/2007 |
| KR | 20070106818 | 11/2007 |

(Continued)

OTHER PUBLICATIONS

Soltman et al., "Inkjet-Printed Line Morphologies and Temperature Control of the Coffee Ring Effect," American Chemical Society, 2008, vol. 24, No. 5, pp. 2224-2231 (published on Web Jan. 16, 2008).

(Continued)

*Primary Examiner* — Duy T Nguyen
(74) *Attorney, Agent, or Firm* — Blakely Sokoloff Taylor Zafman LLP

(57) ABSTRACT

A method of manufacturing solar cells is disclosed. The method comprises depositing an etch-resistant dopant material on a silicon substrate, the etch-resistant dopant material comprising a dopant source, forming a cross-linked matrix in the etch-resistant dopant material using a non-thermal cure of the etch-resistant dopant material, and heating the silicon substrate and the etch-resistant dopant material to a temperature sufficient to cause the dopant source to diffuse into the silicon substrate.

19 Claims, 16 Drawing Sheets

(56) References Cited

U.S. PATENT DOCUMENTS

| | | | |
|---|---|---|---|
| 5,057,439 | A | 10/1991 | Swanson et al. |
| 5,747,381 | A | 5/1998 | Wu et al. |
| 7,709,307 | B2 | 5/2010 | Kamath et al. |
| 7,767,520 | B2 | 8/2010 | Kamath et al. |
| 7,901,656 | B2 | 3/2011 | Winter et al. |
| 7,977,240 | B1 | 7/2011 | Rockenberger et al. |
| 8,399,878 | B2 | 3/2013 | Hieslmair et al. |
| 8,426,905 | B2 | 4/2013 | Kamath et al. |
| 2006/0094189 | A1 | 5/2006 | Zurcher et al. |
| 2007/0095445 | A1 | 5/2007 | Gangopadhyay et al. |
| 2008/0035198 | A1 | 2/2008 | Teppe et al. |
| 2009/0205712 | A1* | 8/2009 | Cousins ............ 136/261 |
| 2009/0239363 | A1 | 9/2009 | Leung et al. |
| 2009/0286393 | A1 | 11/2009 | Mathew et al. |
| 2009/0301549 | A1 | 12/2009 | Moslehi |
| 2010/0081264 | A1 | 4/2010 | Leung et al. |
| 2010/0084729 | A1 | 4/2010 | Steinbrueck et al. |
| 2010/0099236 | A1 | 4/2010 | Kwon et al. |
| 2010/0139764 | A1* | 6/2010 | Smith ............ 136/256 |
| 2011/0003424 | A1 | 1/2011 | De Ceuster et al. |
| 2011/0021012 | A1 | 1/2011 | Leung et al. |
| 2011/0070681 | A1 | 3/2011 | Nakayashiki et al. |
| 2011/0318939 | A1 | 12/2011 | Shimoda et al. |
| 2013/0081677 | A1 | 4/2013 | Loscutoff et al. |
| 2013/0081680 | A1 | 4/2013 | Molesa et al. |
| 2013/0081687 | A1 | 4/2013 | Wu et al. |
| 2013/0098266 | A1 | 4/2013 | Zhou et al. |

FOREIGN PATENT DOCUMENTS

| | | |
|---|---|---|
| KR | 10-2011-0101141 | 9/2011 |
| WO | WO-2008141415 | 11/2008 |
| WO | IB-2009/152146 | 12/2009 |
| WO | WO-2009-152146 | 12/2009 |
| WO | WO-2010/079842 | 7/2010 |
| WO | WO 2011073971 | 6/2011 |

OTHER PUBLICATIONS

Molesa et al., "High-quality inkjet-printed multilevel interconnects and inductive components on plastic for ultra-low-cost RFID applications," Materials Research Society Symposium Proceedings, 2003, pp. H8.3.1-H8.3.6.

International Search Report and Written Opinion from PCT/US2012/057349 mailed Mar. 27, 2013, 9 pgs.

International Search Report and Written Opinion from PCT/US2012/057350 mailed Mar. 25, 2013, 13 pgs.

International Search Report and Written Opinion for PCT Patent Application No. PCT/US2012/057348 mailed Jul. 24, 2013, 12 pgs.

Non-Final Office Action from U.S. Appl. No. 13/250,215 mailed Sep. 6, 2013, 10 pgs.

Non-Final Office Action for U.S. Appl. No. 13/250,594 mailed Feb. 13, 2013, 17 pgs.

Notice of Allowance and Fees for U.S. Appl. No. 13/250,594 mailed Jul. 15, 2013, 11 pgs.

Final Office Action from U.S. Appl. No. 13/250,215 mailed Sep. 5, 2014, 8 pgs.

First Action Interview Pilot Program Pre-Interview Communication from U.S. Appl. No. 13/250,988 mailed Oct. 22, 2014, 4 pgs.

International Preliminary Report on Patentability dated Apr. 1, 2014, in International Patent Application No. PCT/US2012/057348, 9 pages.

International Preliminary Report on Patentability dated Apr. 1, 2014, in International Patent Application No. PCT/US2012/057349, 8 pages.

International Preliminary Report on Patentability dated Apr. 1, 2014, in International Patent Application No. PCT/US2012/057350, 9 pages.

Office Action mailed Mar. 5, 2014, in U.S. Appl. No. 13/250,215, 6 pages.

* cited by examiner

METHOD FOR FORMING DIFFUSION REGIONS IN A SILICON SUBSTRATE

CROSS-REFERENCE TO RELATED APPLICATIONS

This application is a divisional of U.S. patent application Ser. No. 13/250,594, filed on Sep. 30, 2011, the entire contents of which are hereby incorporated by reference herein.

STATEMENT REGARDING FEDERALLY SPONSORED RESEARCH OR DEVELOPMENT

The United States government has a paid-up license in this invention and the right in limited circumstances to require the patent owner to license others on reasonable terms as provided by the terms of DE-FC36-07GO17043 awarded by the DOE.

TECHNICAL FIELD

Embodiments of the subject matter described herein relate generally to solar cell manufacture. More particularly, embodiments of the subject matter relate to thin silicon solar cells and techniques for manufacture.

BACKGROUND

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Accordingly, techniques for improving the fabrication process and reducing the cost of manufacturing solar cells are generally desirable. Such techniques include printing and curing of dopants on silicon substrates through processes like ink-jet printing. These or other similar embodiments form the background of the current invention.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
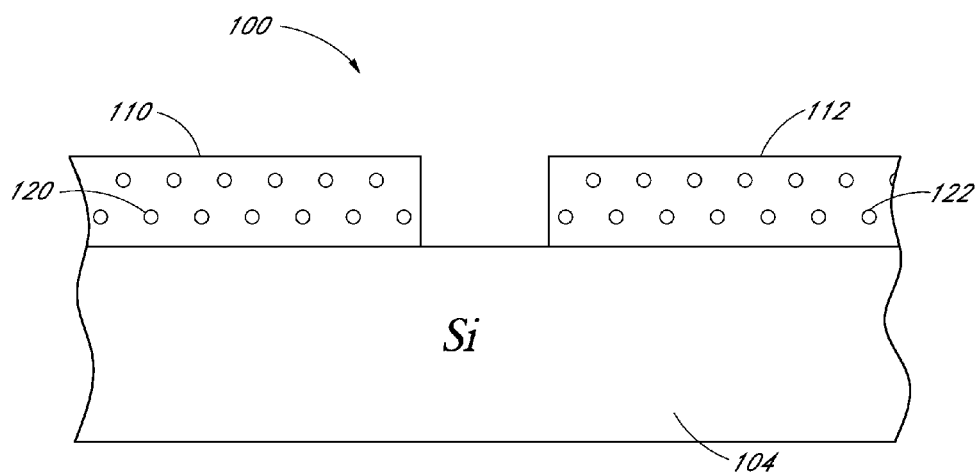
FIGS. 1-9 are cross-sectional representations of a solar cell being fabricated in accordance with an embodiment of the invention

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

One technique for simplifying formation of doped diffusion regions in a silicon substrate during the photovoltaic solar cell manufacturing process is using printed dopant paste, including ink-jet dispensed dopants, on a silicon substrate. The printed dopant paste can be then heated to drive dopant material into the underlying silicon to create a doped diffusion region in the silicon substrate, a step in creating a photovoltaic solar cell. Certain printed dopant pastes can become thermally unstable, resulting in outgassing of dopant material from the dopant paste into the ambient environment. This, in turn, can cause counterdoping, where the outgassed dopant in the ambient environment may re-deposit in undesired areas of the silicon substrate. This thermal instability can manifest during any post-print heating process, including bake and dopant driving processes, when the temperature of the environment is being raised. It should be noted that any reference to a dopant paste refers to a suspension or solution of any type which includes doping materials. The substance need not be a paste, but can be a liquid, solution, suspension, solid, semi-solid, or any other physical state.

An improvement to the process can be to perform a non-thermal cure process to form a cross-linked matrix in the dopant paste prior to the thermal dopant driving step. In one embodiment, for example, this process can reduce the thermal-driven mass-loss phenomena or outgassing during the heating for dopant driving by photo-polymerization or photo-curing of the dopant paste.

A method of manufacturing solar cells is disclosed. The method comprises depositing an etch-resistant dopant material on a silicon substrate, the etch-resistant dopant material comprising a dopant source, forming a cross-linked matrix in the etch-resistant dopant material using a non-thermal cure of the etch-resistant dopant material, and heating the silicon substrate and the etch-resistant dopant material to a temperature sufficient to cause the dopant source to diffuse into the silicon substrate.

Another method of manufacturing solar cells is disclosed. The method comprises depositing a dopant material on a silicon substrate having a photovoltaic solar cell structure, forming a cross-linked matrix in the dopant material using a non-thermal exposure of the etch-resistant dopant material to ultraviolet light through a photo-polymerization process, and heating the silicon substrate of the dopant material to a temperature sufficient to cause the dopant source to diffuse into the silicon substrate.

Yet another method of manufacturing solar cells is disclosed. The method comprises forming a thin dielectric layer on a surface of a silicon substrate, forming a polysilicon layer over the thin dielectric layer, depositing an etch-resistant dopant material comprising a dopant source material on the polysilicon layer, forming a cross-linked matrix in the etch-resistant dopant material using a non-thermal cure of the etch-resistant dopant material, heating the etch-resistant dopant material to a temperature wherein the dopant source material diffuses into the polysilicon layer, and selectively etching to remove the dopant source material without etching the polysilicon layer.

Figure 5:
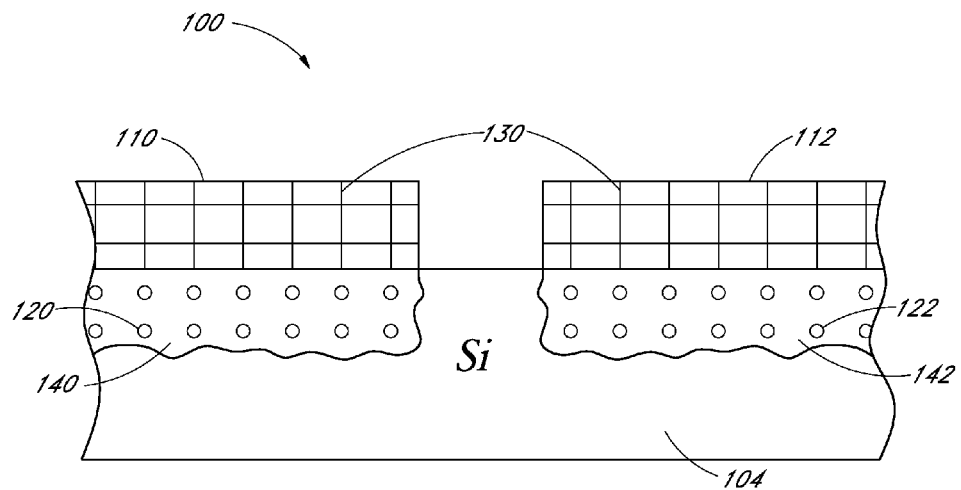
Figure 6:
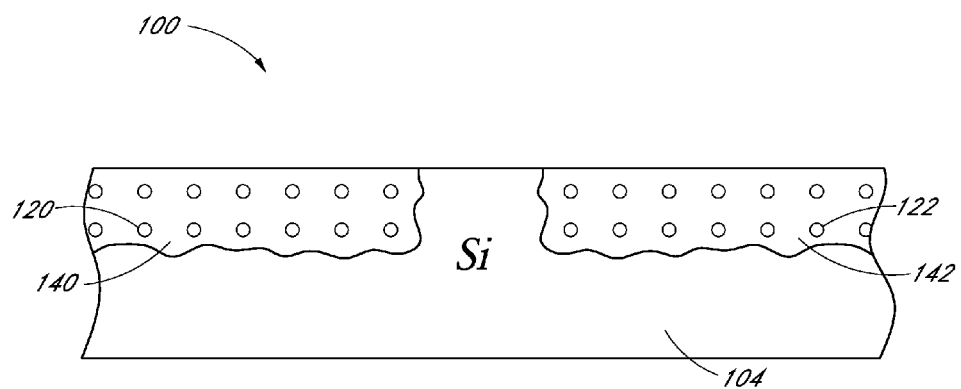
Figure 7:
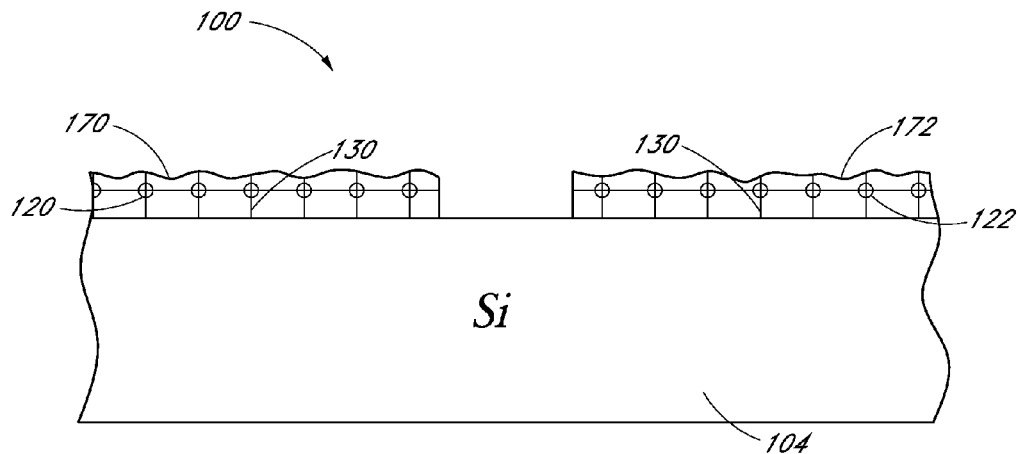
Figure 8:
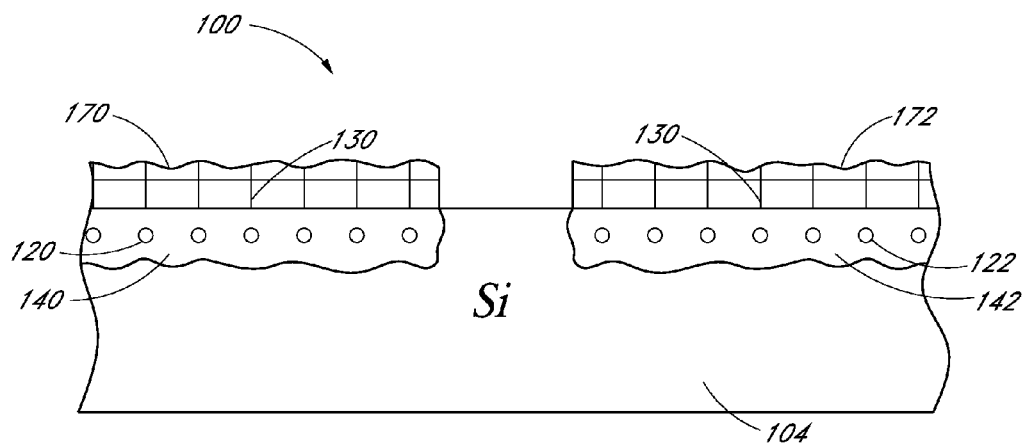
Figure 9:
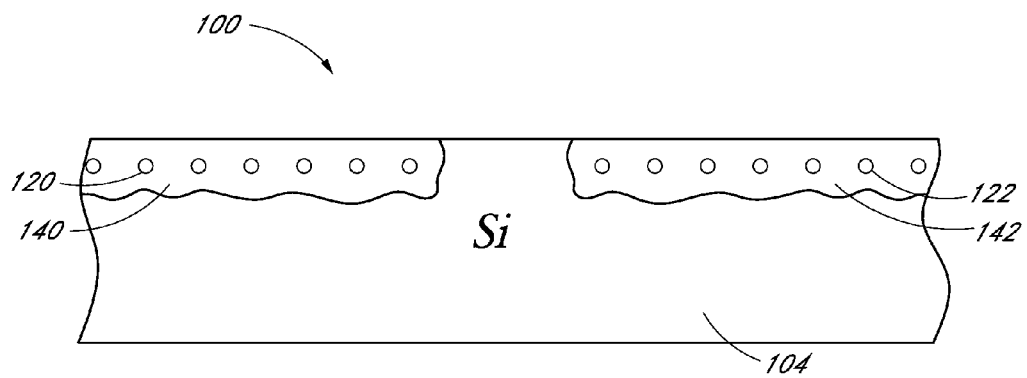

The various tasks performed in connection with the manufacturing process shown in FIGS. 2-6 may include any number of additional or alternative tasks such as FIGS. 7-9. The manufacturing process shown in FIGS. 10-17 and FIGS. 18-31 need not be performed in the illustrated order, and it may be incorporated into a more comprehensive procedure, process or fabrication having additional functionality not described in detail herein.

FIG. 1 illustrates a solar cell 100 comprising a silicon substrate 104. The solar cell 100 comprises the silicon substrate 104 and an etch-resistant dopant material 110, 112 deposited on the surface of the silicon substrate 104. The etch-resistant dopant material 110, 112 can be dispensed in liquid or semi-liquid form on the silicon substrate 104 through various techniques, but is not limited to, comprising the following: screen printing, ink-jet printing and spin coating. Although two regions of etch-resistant dopant material 110, 112 are shown, more or fewer can be deposited on the silicon substrate 104 in other embodiments. The etch-resistant dopant material 110, 112 can be formed in repeated patterns, including masked patterns, on the silicon substrate 104.

In certain embodiments, each deposition of etch-resistant dopant material 110, 112 can comprise a solvent, a pre-matrix material, and a dopant source 120, 122. Various embodiments of the etch-resistant dopant material 110, 112 can contain all or some selection of these components, as well as other components, as desired. In certain embodiments, the etch-resistant dopant material 110, 112 can have properties similar to those disclosed in dopant materials described in U.S. patent application Ser. No. 13/250,215, titled "DOPANT INK COMPOSITION AND METHOD OF FABRICATING A SOLAR CELL THERE FROM", filed on Sep. 30, 2011.

The dopant source 120, 122 can comprise a single-polarity dopant source including either a positive-type dopant source or negative-type dopant source. For example, a positive-type dopant source can include boron or a boron composite, while a negative-type dopant source can include phosphorus or a phosphorus composite.

Although referred to as an etch resistant dopant material, the dopant material containing the dopant source and other components described above can in some embodiments have no etch resistance properties accordingly, in some embodiments the dopant material can be used solely for doping and not in any etch process. Additionally, when referred to as etch resistant the dopant material need only be resistant to a single type of etchant. In some embodiments the etch resistant dopant material can resist a wide spectrum of etchants. In other embodiments it can resist a few. Moreover the etch resistant dopant material can be resistant to one type of etchant while susceptible to etching by another type of etchant. Thus the dopant material or etch resistant dopant material is used interchangeably throughout to refer to dopant materials which have the appropriate properties to perform the functions described throughout. Therefore although referred to as an etch resistant dopant material it should be understood that the appropriate dopant material can be selected for the desired embodiment, depending on whether etch resistance is required or not.

The configuration of etch-resistant dopant material 110, 112 in independent groups merely suggests one configuration in which the dopant sources 120, 122 are intended to be driven into the silicon substrate and, hence, the arrangement into which the etch-resistant dopant materials 110, 112 can be dispensed. In some embodiments it is possible for a positive-type dopant source to be found in the location of the etch-resistant dopant material 110 and a negative-type dopant source to be found in the etch-resistant dopant material 112. The opposite can also be true, where negative-type dopant source is dispensed in the location of the etch-resistant dopant material 110 and a positive-type dopant source is dispensed in the etch-resistant dopant material 112. In another embodiment, it is possible for both the etch-resistant dopant materials 110, 112 to both contain either only positive-type dopant sources or negative-type dopant sources.

The solar cell 100 formed can be a back contact, back junction (BCBJ) solar cell in any of a number of embodiments, including those illustrated and described herein. Although the solar cell 100 can have any number of the discussed embodiments it is not limited to the structures described therein.

FIGS. 2-6 further illustrate processing of solar cell 100 in sequential steps of the solar cell manufacturing process using printed dopants on silicon substrates.

Figure 2:
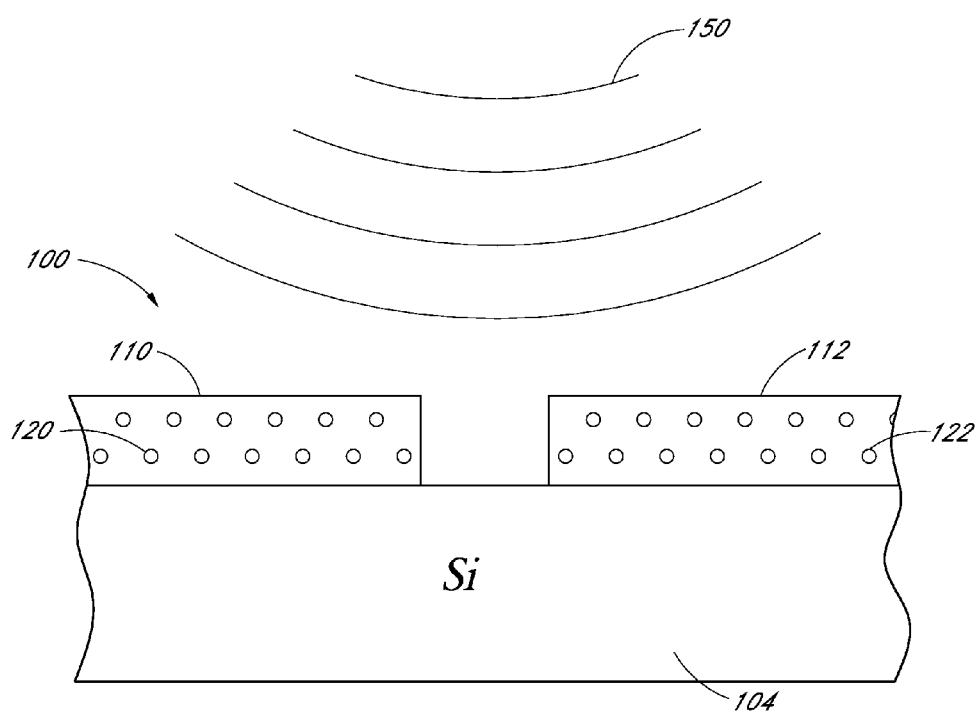
Figure 3:
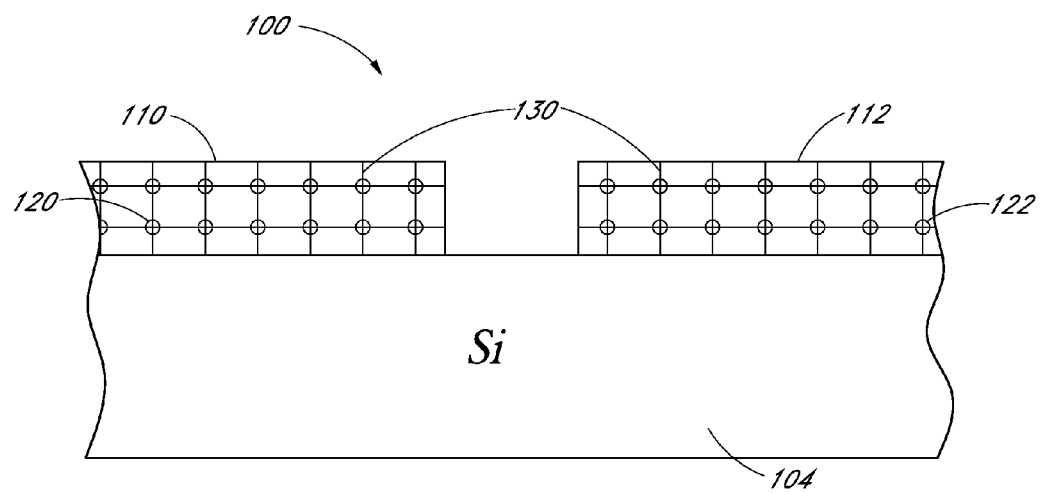

FIGS. 2-3 illustrate a non-thermal cure of the etch-resistant dopant material 110, 112 forming a cross-linked matrix 130 on the silicon substrate 104.

A non-thermal cure 150 of the etch-resistant dopant material 110, 112 can be performed after deposition of the etch-resistant dopant material 110, 112. A non-thermal cure 150 can be causing a phase change of the etch-resistant dopant material 110, 112 during the forming of the cross-linked matrix 130 on the silicon substrate 104. In some embodiments, the non-thermal cure 150 of the etch-resistant dopant material 110, 112 forming a cross-linked matrix 130 can comprise exposing the etch-resistant dopant material 110, 112 to non-infrared electromagnetic radiation. The exposure to the non-infrared electromagnetic radiation can further comprise exposure of the etch-resistant dopant material 110, 112 to ultraviolet light. In some embodiments, the non-thermal cure 150 can further comprise exposure of the etch-resistant dopant material 110, 112 to light in the visible spectrum. For example, the non-thermal cure 150 can include exposure of the etch-resistant dopant material 110, 112 to electromagnetic (EM) radiation having a wavelength between 380 and 760 nanometers, including sequences of such EM radiation, such as pulses, flashes, or changing intensity. In certain embodiments, the sequences can include repetitions of the same wavelength of EM radiation, while in others, several different wavelengths of EM radiation can be used in the same sequence.

In yet another embodiment the non-thermal cure 150 of the etch-resistant dopant material 110, 112 can comprise transmitting acoustic waves toward the etch-resistant dopant material 110, 112, thereby forming a cross-linked matrix 130 in the etch-resistant dopant material 110, 112 on the silicon substrate 104.

FIG. 3 illustrates the ordered structure of the dopant sources 120, 122 is due to the cross-linked matrix 130 within the etch-resistant dopant material 110, 112 formed on the silicon substrate 104. Although illustrated as a rectilinear grid, the cross-linked matrix 130 present in the dopant material 110, 112 can form any arrangement resulting from the non-thermal cure step 150 and composition of the dopant material 110, 112. Thus, in certain embodiments, crystalline structures can be formed, as an example. Moreover, although the dopant source 120, 122 is illustrated as arranged at vertices within the cross-linked matrix 130, the dopant source 120, 122 can be interstitially arranged, or otherwise present in the dopant material 110, 112 without being bonded with or coupled to or integral of the cross-linked matrix 130. Additionally, the cross-linked matrix 130 need not be a physical arrangement and can instead be formed of chemical bonding, such as covalent bonding, within the dopant material 110, 112, where such bonds are formed as a result of the non-thermal cure step 150. Thus, the cross-linked matrix 130 can include spirals, helical, or other structural arrangements, including bonds or linking between such structures.

Figure 4:
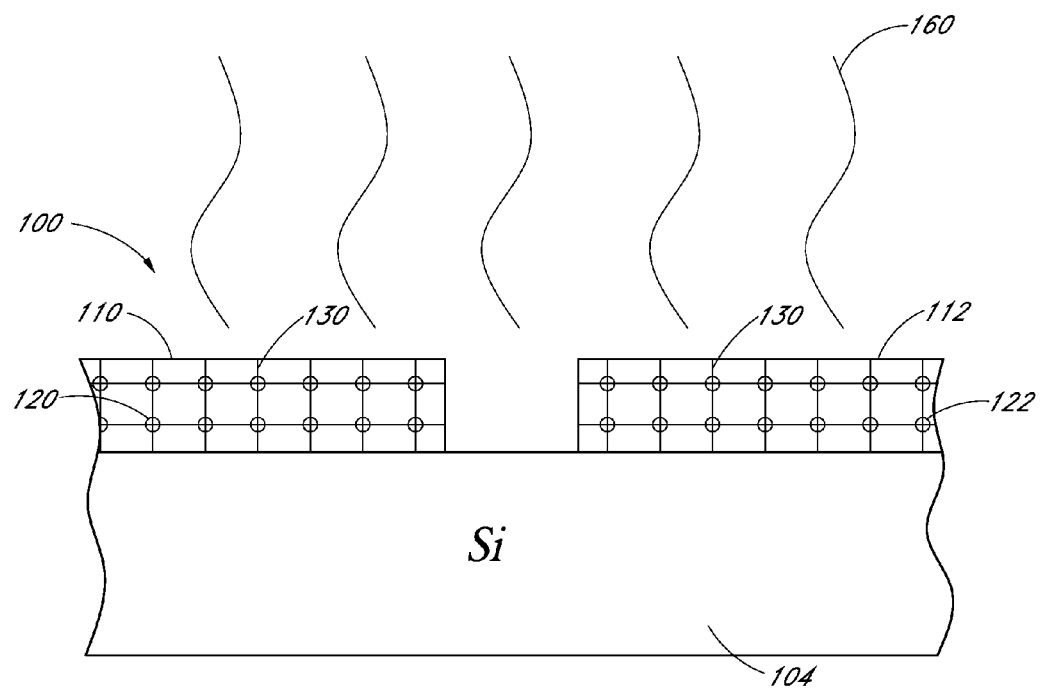

FIGS. 4-6 illustrates heating 160 the silicon substrate 104 and the etch-resistant dopant material 110, 112 to a temperature sufficient to cause the dopant source to diffuse 140, 142 into the silicon substrate 104. Such a diffusion can include interstitial substitution of the dopant source 120 into the silicon lattice. In certain embodiments, the silicon substrate 104 can then be selectively etched to remove the etch-resistant dopant material 110, 112 without etching the silicon substrate 104.

FIG. 4 illustrates the thermal heating 160 of the etch-resistant dopant material 110, 112 on the silicon substrate 104 causing the dopant source 120, 122 to diffuse into the silicon substrate 104. The thermal heating 160 can comprise of raising the temperature of the etch-resistant dopant material 110, 112 on the silicon substrate 104 to a first temperature of at least 400° Celsius, at most 1200° C. anywhere therebetween. In certain embodiments, thermal cycling can be used, raising and lowering the temperature to any desired temperature for any desired length of time to accomplish the dopant diffusion. This process may be performed using specific temperature profiles that are optimized to get the most uniform diffusion of dopant source 120, 122 into the silicon substrate 104. The dopant source 120, 122 can have a concentration in the diffusion regions 140, 142 of at least $1 \times 10^{17}$ atoms per cubic centimeter. In other embodiments, greater or lower concentrations of dopant source 120, 122 in the diffusion regions 140, 142 can be present. Any type of doping of the silicon substrate 104 or other target surface can be accomplished using this technique, including interstitial or substitution diffusion.

FIG. 5 illustrates the diffusion of the dopant sources 120, 122 into the silicon substrate 104 after performing the thermal heating 160. The dopant source 120, 122 shown in FIG. 5 may comprise a single-polarity dopant source including either a positive-type dopant source or negative-type dopant source resulting in the corresponding polarity in the diffusion regions 140, 142.

FIG. 6 illustrates a subsequent step, wherein the silicon substrate 104 is selectively etched to remove the etch-resistant dopant material 110, 112 without etching the silicon substrate 104, including the diffusion regions 140, 142. With the etch-resistant dopant material 110, 112 removed, the solar cell 100 comprises at least the silicon substrate 104 and the diffused regions 140, 142, though earlier processing steps may have added other structures, as later processing steps may also.

FIG. 7-9 illustrates an alternative embodiment in which the step of reducing the volume of solvent in the etch-resistant dopant material 110, 112 by heating the etch-resistant dopant material to at least 200° Celsius after forming the cross-linked matrix 130 in the reduced etch-resistant dopant material 170, 172 is performed. As shown in FIG. 7, the reduced volume of the etch-resistant dopant material 110, 112 can be caused by heating the silicon substrate 104, including the etch-resistant dopant material 110, 112. In certain embodiments, the drive-off of the solvent can be accomplished without altering the structure of the cross-linked matrix 130. FIGS. 8 and 9 illustrate a subsequent diffusion step, similar to that shown in FIG. 5 above, and a dopant material removal step similar to that shown in FIG. 6 above.

Figure 10:
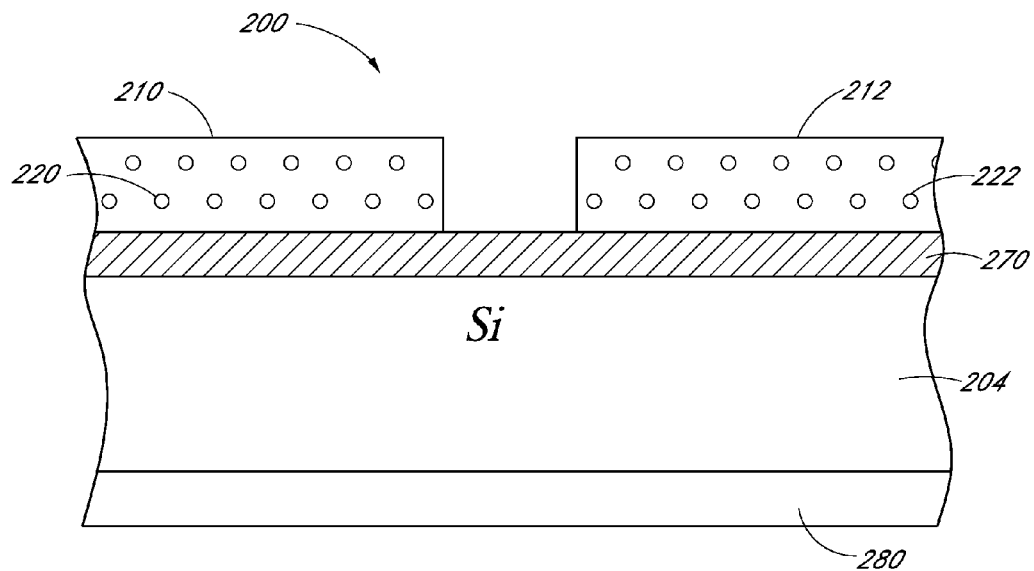
FIGS. 10-17 are cross-sectional representations of a solar cell being fabricated in accordance with another embodiment of the invention

FIG. 10 illustrates an embodiment of a solar cell 200 formed with a thin dielectric layer 270 atop of the silicon substrate 204. Unless otherwise indicated, components in FIGS. 10-17 are similar to those described above with reference to FIGS. 1-9, except that the numerical indicator used to designate the component has been incremented by 100. Below the silicon substrate 204 can be an anti-reflective coating (ARC) 280. These and other elements of a solar cell structure can be present on either side of the solar cell 200 at various points during fabrication of the solar cell 200. Accordingly, the formation of diffusion regions can occur during any appropriate place in the fabrication process. Thus, an etch-resistant dopant material 210, 212 can be deposited on the surface of the dielectric layer 270. The etch-resistant dopant material 210, 212 can be include a member of a chemical group comprising silanes, cyclosilanes, and siloxanes.

Figure 11:
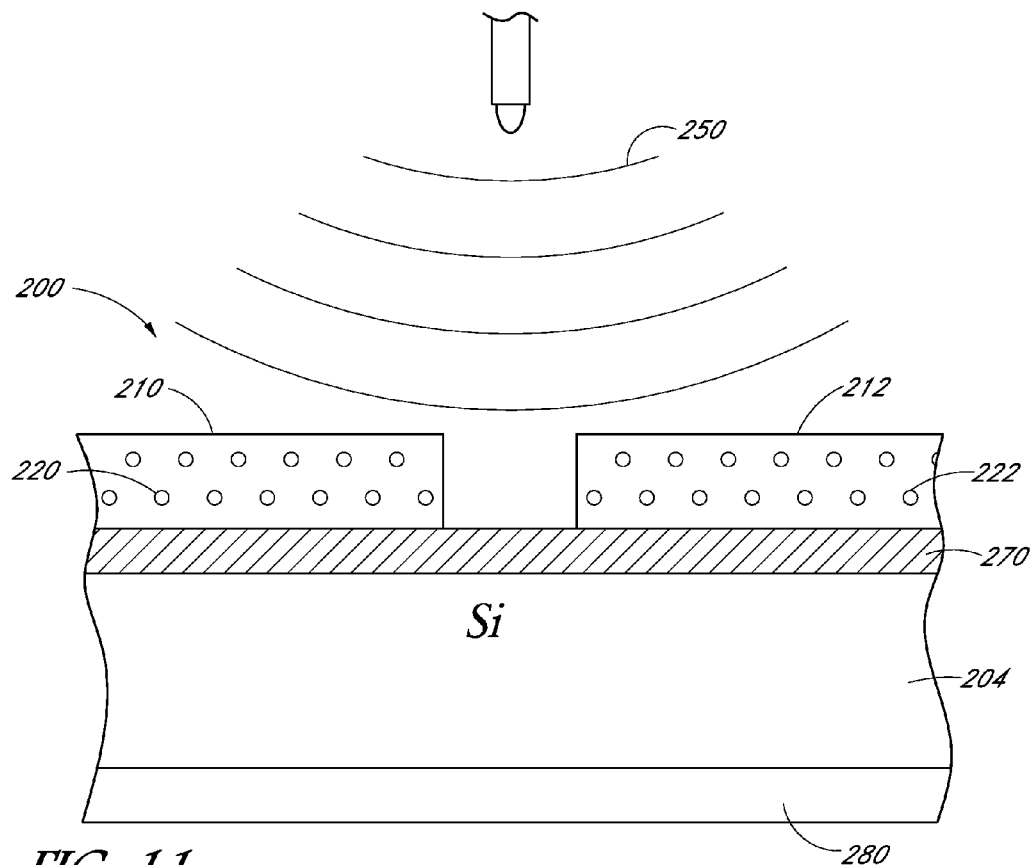

FIG. 11 illustrates exposure of the etch-resistant dopant material 210, 212 to ultraviolet light 250. The ultraviolet light 250 cause a phase change in the etch-resistant dopant material 210, 212, causing the formation of the cross-linked matrix 230 through a photo-polymerization process. In one embodiment the ultraviolet light exposure 250 of the etch-resistant dopant material 210, 212 forming a cross-linked matrix 130 can comprise of exposing the etch-resistant dopant material 210, 212 to electromagnetic radiation having a wavelength of between 8 and 400 nanometers. UV exposure can last for any desired period of time, although a shorter duration of exposure to achieve sufficient cross-linked matrix formation can be beneficial, as compared to a relatively longer duration, for throughput purposes during mass production. The exposure to the ultraviolet light exposure 250 can cause a curing step such as acrylate polymerization, cationic polymerization, thiolene chemical application, and hydrosilane addition.

Figure 12:
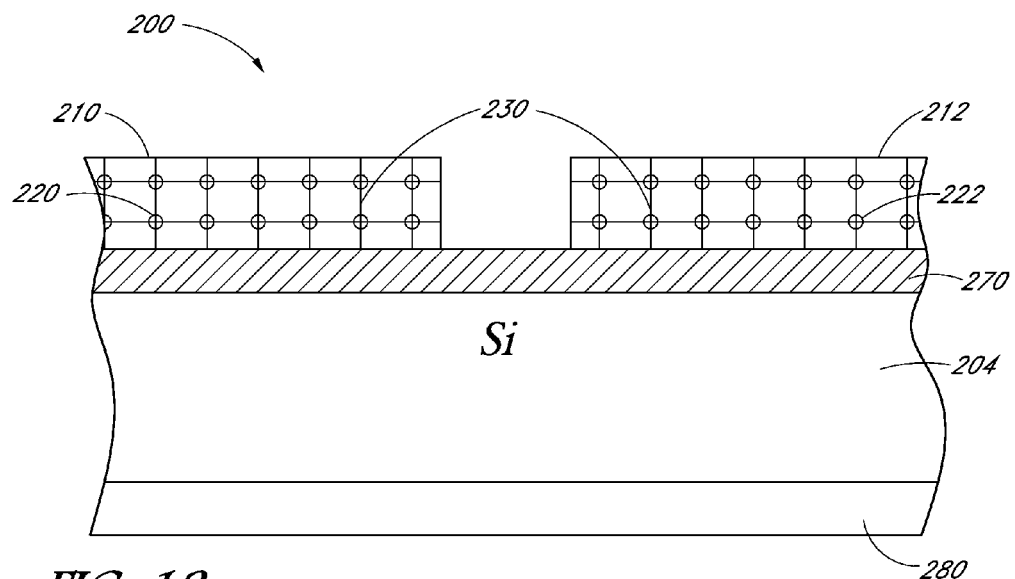

FIG. 12 illustrates the cross-linked matrix 230 within the etch-resistant dopant material 210, 212 formed on the dielectric layer 270.

Figure 13:
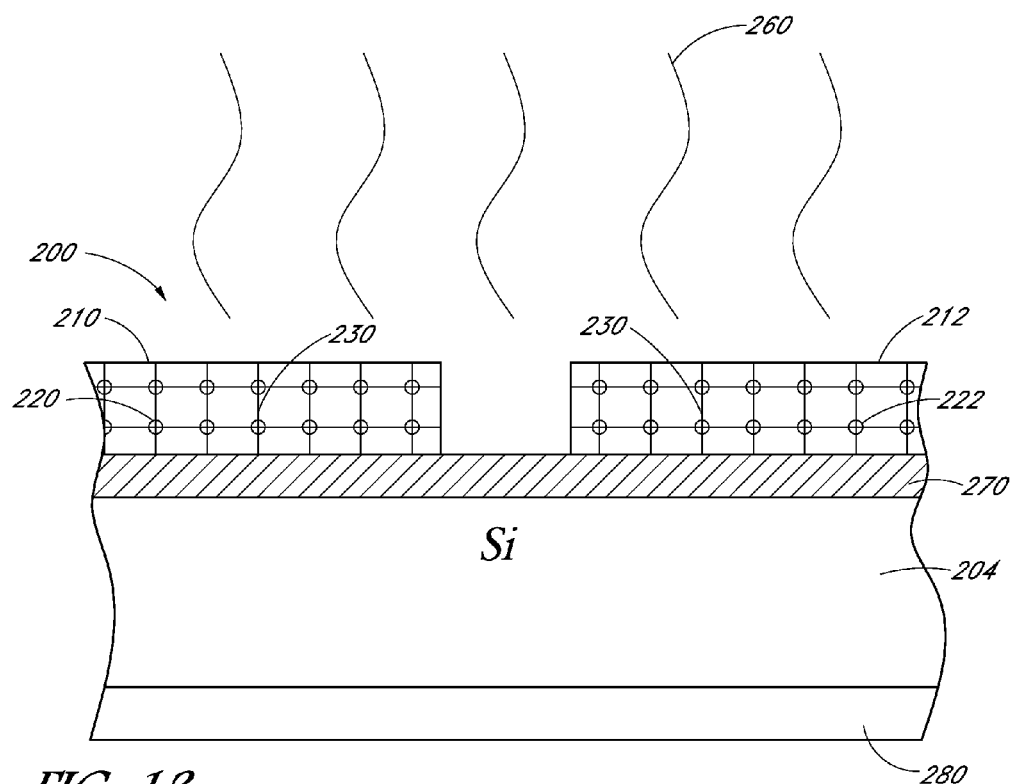

FIG. 13 illustrates the thermal heating 260 of the etch-resistant dopant material 210, 212, thereby causing the dopant source 220, 222 to diffuse into the silicon substrate 204.

Figure 14:
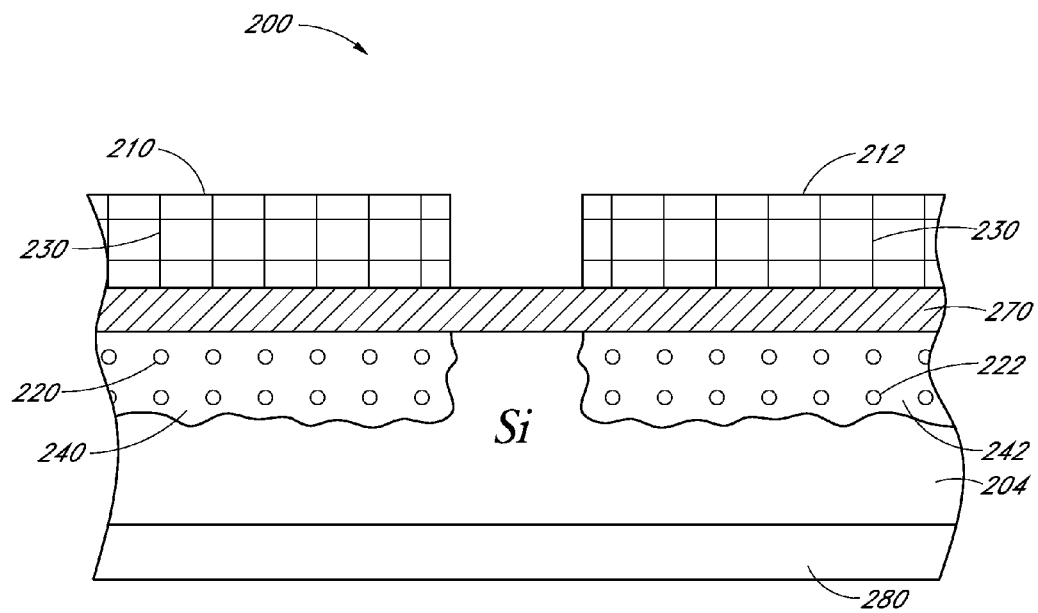

FIG. 14 illustrates the diffusion of the dopant sources 220, 222 into the silicon substrate 204 after performing the thermal heating 260 resulting in the diffused region 240, 242.

Figure 15:
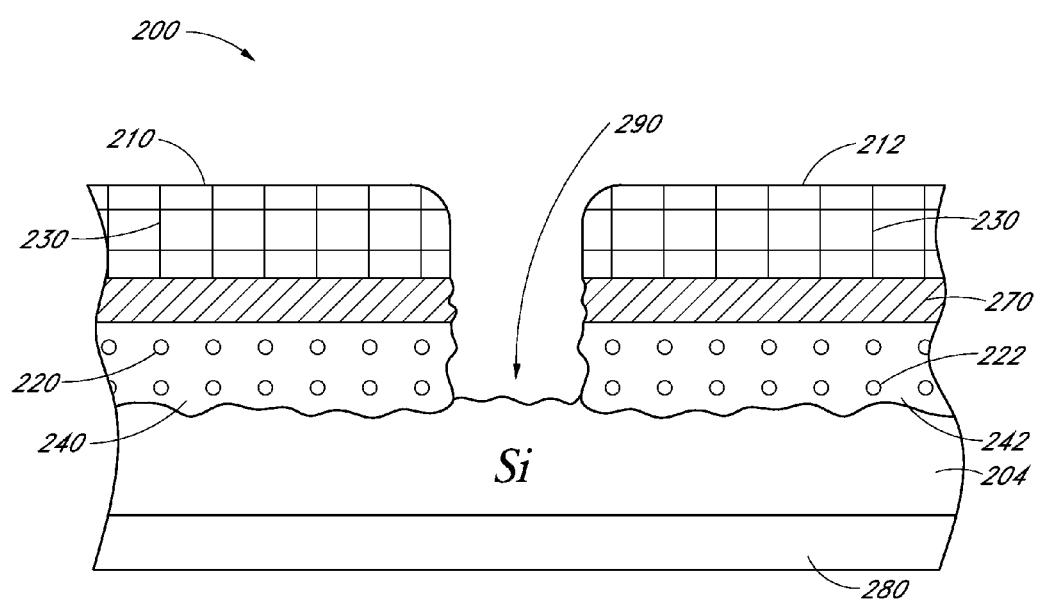

FIG. 15 illustrates an embodiment of the solar cell 204 further comprising the step of etching the silicon substrate 204 using the etch-resistant dopant material 210, 212 as an etch-mask after forming the cross-linked matrix 230 in the etch-resistant dopant material 210, 212. The result is an etched away exposed region 290 seen in FIG. 15 that may act as a potential barrier between the diffused region 240 and the diffused region 242. The type of etch performed can be selected to etch the dielectric layer 270. Similarly, the underlying silicon substrate 204 can be additionally etched, depending on the selection of etchant and duration of etch bath. The ARC 280 layer can be etched or not, as desired for the embodiment.

Figure 16:
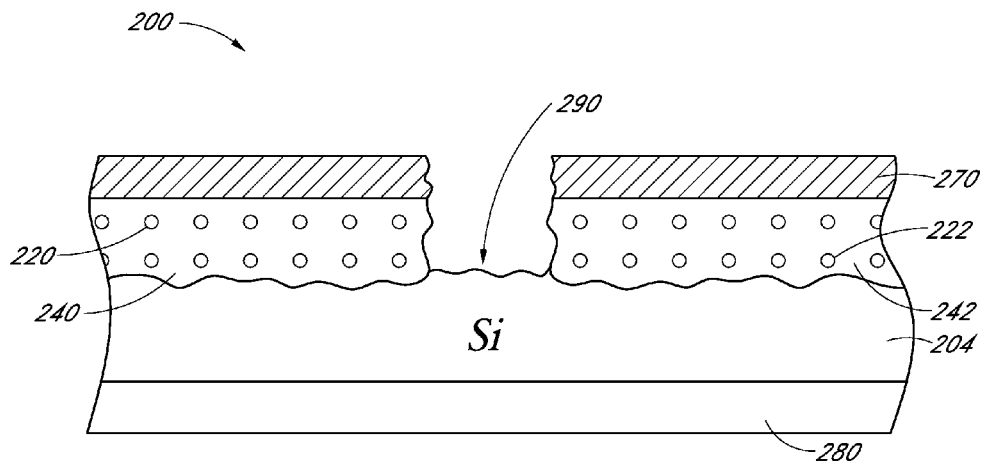

FIG. 16 illustrates the solar cell 200 as a result of performing a selective etching process to remove the etch-resistant dopant material 210, 212 without further etching the silicon substrate 204. With the etch-resistant dopant material removed, the solar cell 200 is comprised of the diffused region 240 and the diffused region 242 separated by the etched away exposed region within the silicon substrate 204.

Figure 17:
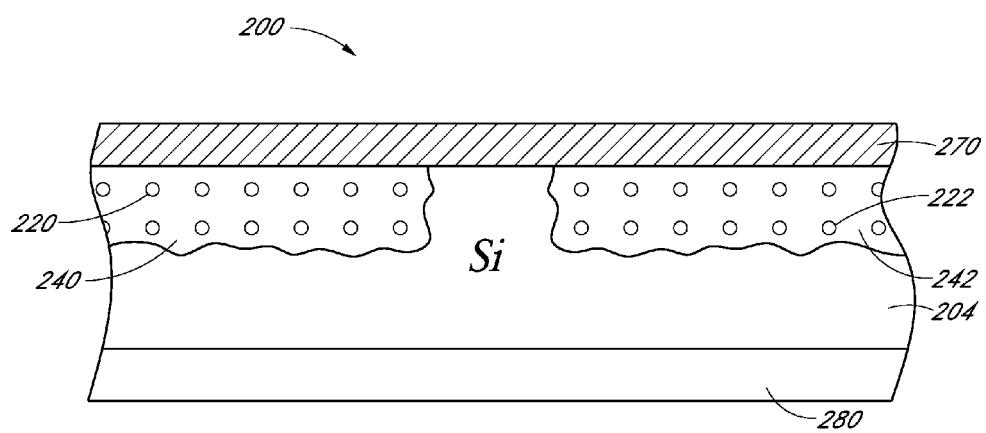

FIG. 17 illustrates an embodiment wherein etching the silicon substrate 204 using the etch-resistant dopant material 210, 212 as an etch-mask after forming the cross-linked matrix 230 in the etch-resistant dopant material 210, 212 does not damage the silicon substrate 204, dielectric layer 270, or any other structure present on the solar cell 200. Such an etching can be used to further process other structural elements of the solar cell 200 not illustrated for clarity.

Figure 18:
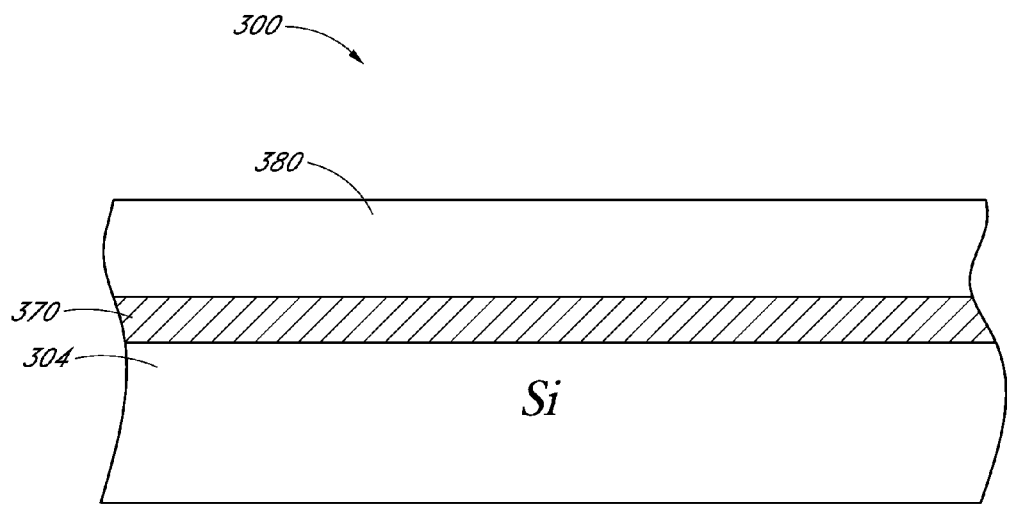
FIGS. 18-31 are cross-sectional representations of a solar cell being fabricated in accordance with yet another embodiment of the invention

FIG. 18 illustrates a solar cell 300 formed with a dielectric layer 370 formed on top of the silicon substrate 304. Unless otherwise indicated, components in FIGS. 18-24 are similar to those described above with reference to FIGS. 10-17, except that the numerical indicator used to designate the component has been incremented by 100. In certain embodiments of the solar cell 300, a polysilicon layer 380 can be formed on top of dielectric layer 370. An etch-resistant dopant material 310, 312 can be deposited, such as by ink-jet or other dispensation, as described above with reference to FIG. 1, on the surface of the polysilicon layer 380. The etch-resistant dopant material 310, 312 can include dopant source 320, 322.

Figure 19:
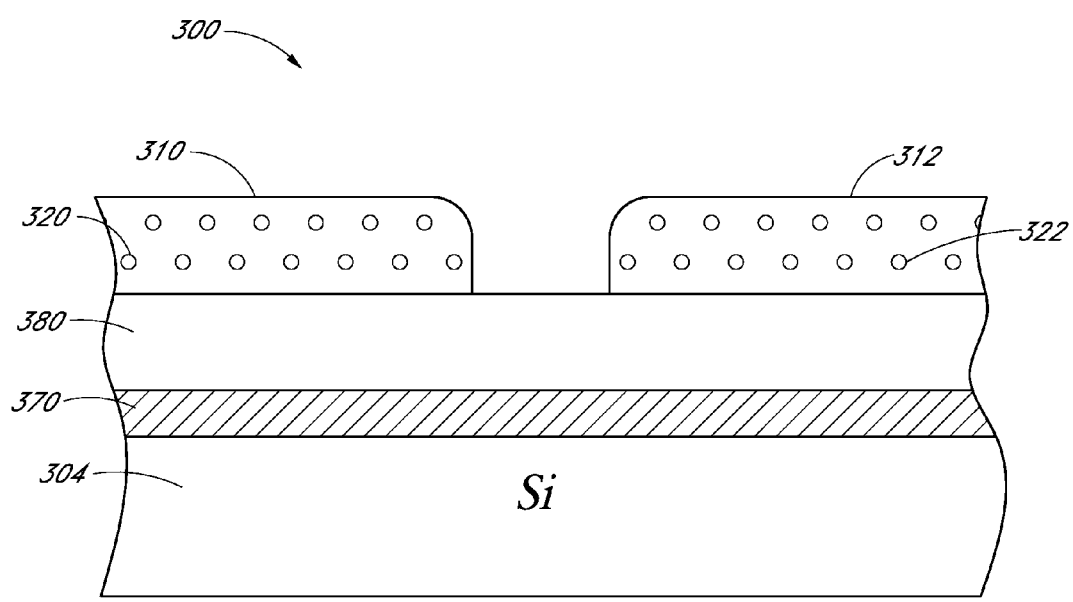
Figure 20:
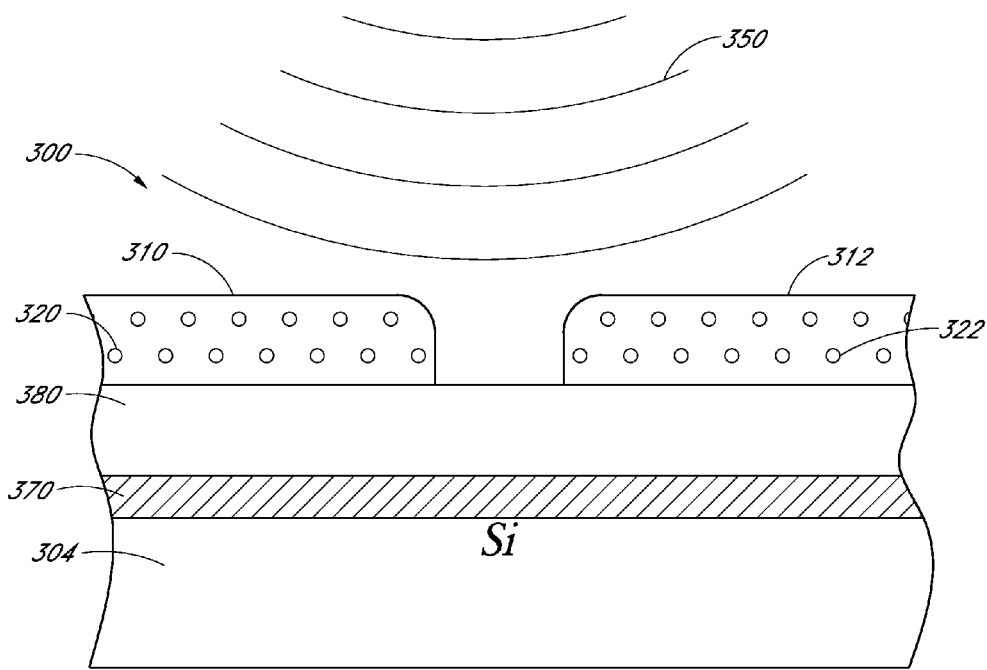
Figure 21:
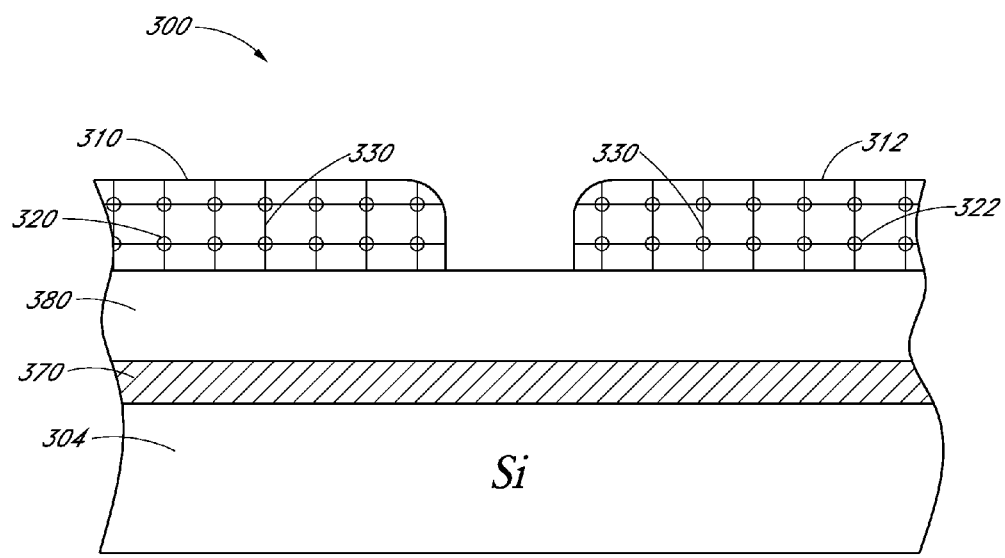

With reference to FIGS. 19-20, a non-thermal cure 350 of the etch-resistant dopant material 310, 312 can be performed to form cross-linked matrix 330 on the silicon substrate 304. FIG. 21 illustrates the ordered structure of the dopant sources 320, 322 is due to the cross-linked matrix 330 within the etch-resistant dopant material 310, 312 formed on the polysilicon layer 380.

Figure 22:
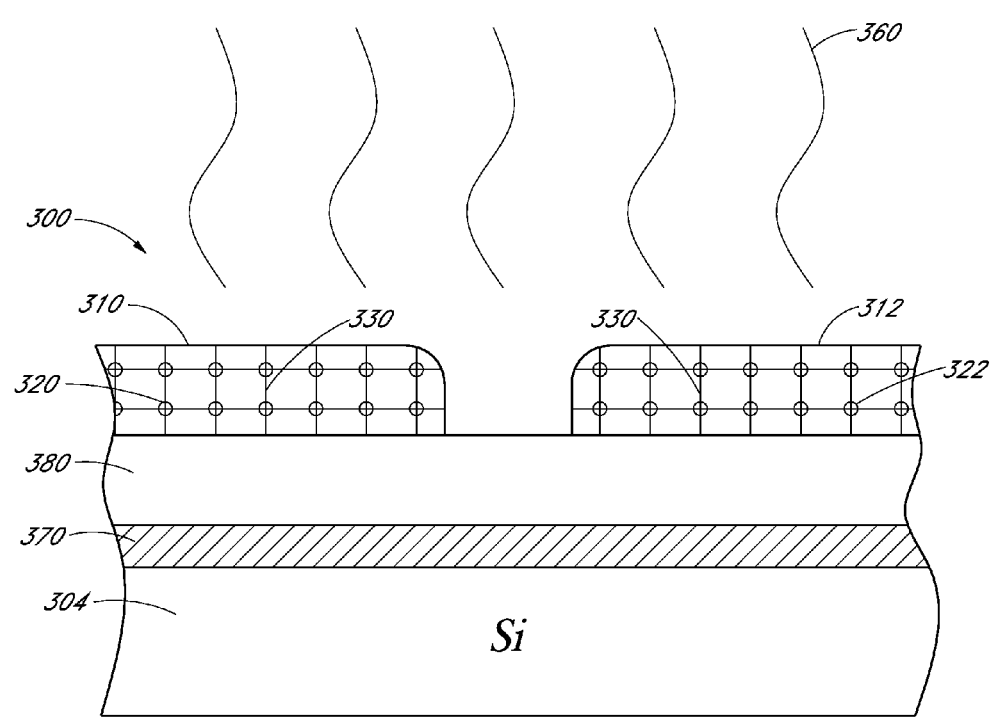
Figure 23:
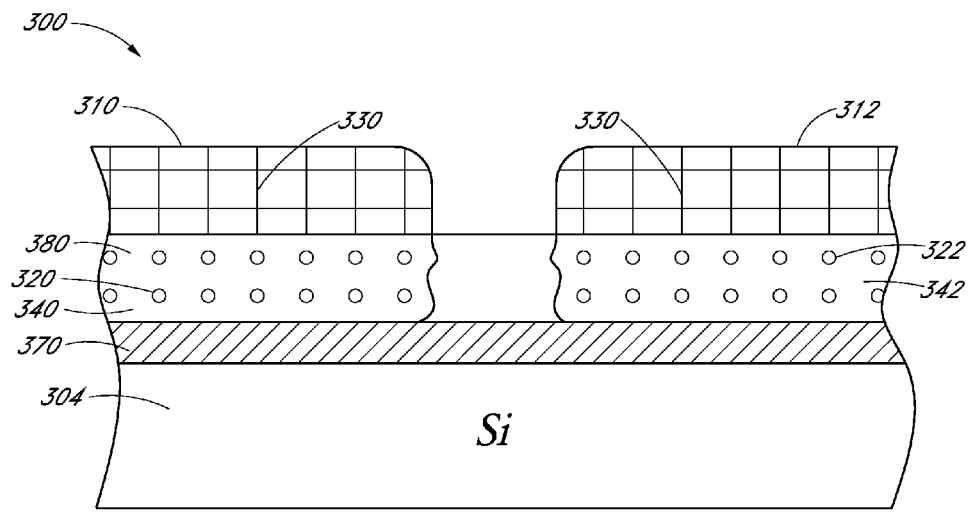
Figure 24:
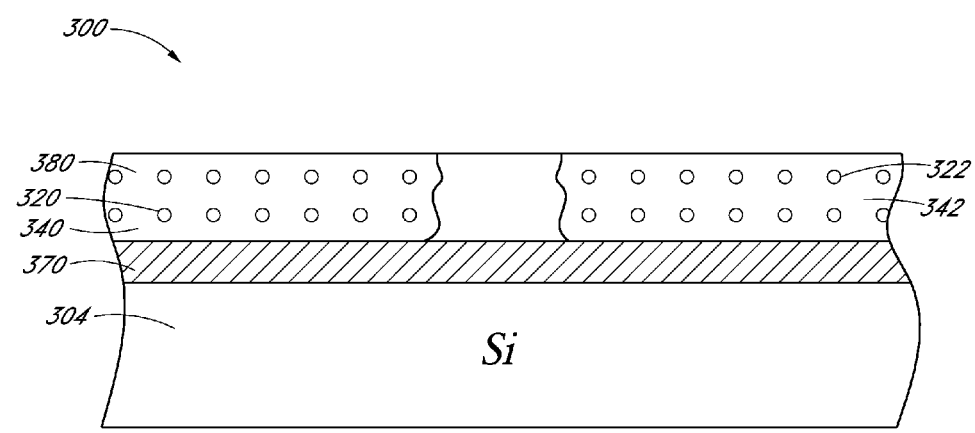

FIGS. 22-24 illustrate the heating 360 of the solar cell 300, including the etch-resistant dopant material 310, 312 and the polysilicon layer 380 to a temperature sufficient to cause the dopant source to diffuse into the silicon substrate 304, as described above with reference to FIGS. 1-9. This process may be performed using specific temperature profiles that are optimized for uniformity of diffusion of dopant source 320, 322 into the polysilicon layer 380, or so as to reach a desired concentration of the dopant source 320, 322 in the silicon substrate 304, thus forming the diffusion regions. Subsequently, the solar cell 300 can be etched to remove the etch-resistant dopant material 310, 312 without etching the silicon substrate 304.

Figure 25:
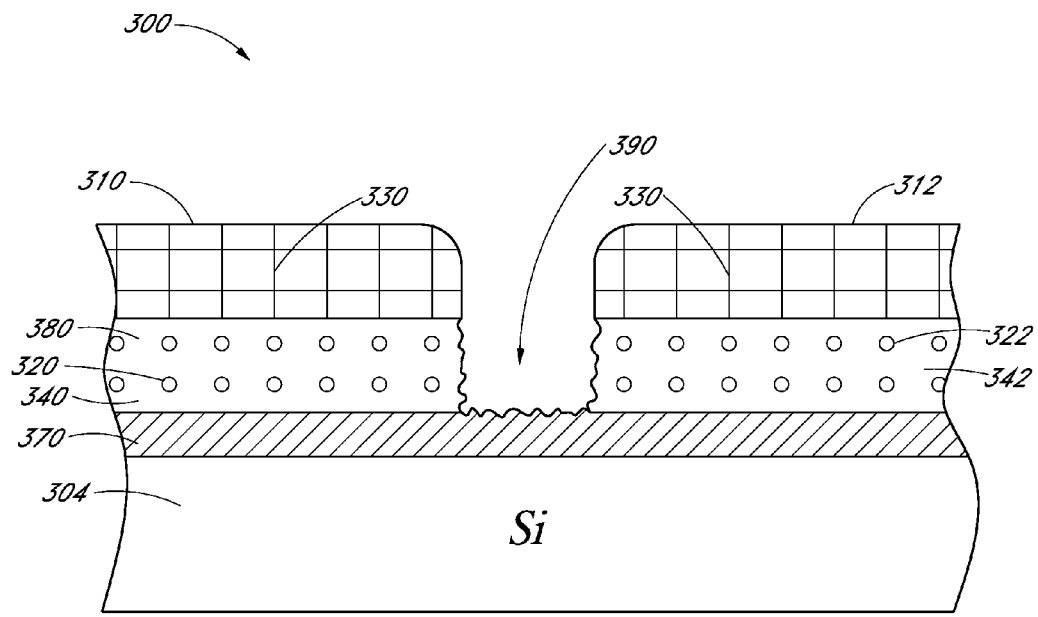
Figure 26:
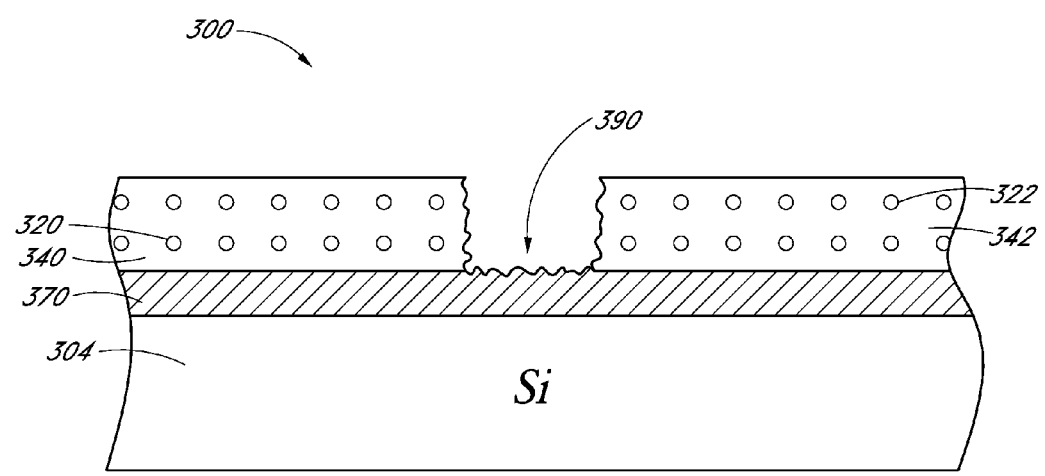

FIGS. 25-26 illustrate the step of etching the polysilicon layer 380 using the etch-resistant dopant material 310, 314 as an etch-mask after thermal heating 360 the etch-resistant dopant material 310, 312. In certain embodiments, the dielectric layer 370 can be similarly etched. The result is an etched away exposed region 390 that acts as a potential barrier between the diffused regions 340, 342. The etch-resistant dopant material 310, 312 can be subsequently washed or etched from the polysilicon layer 380.

Figure 27:
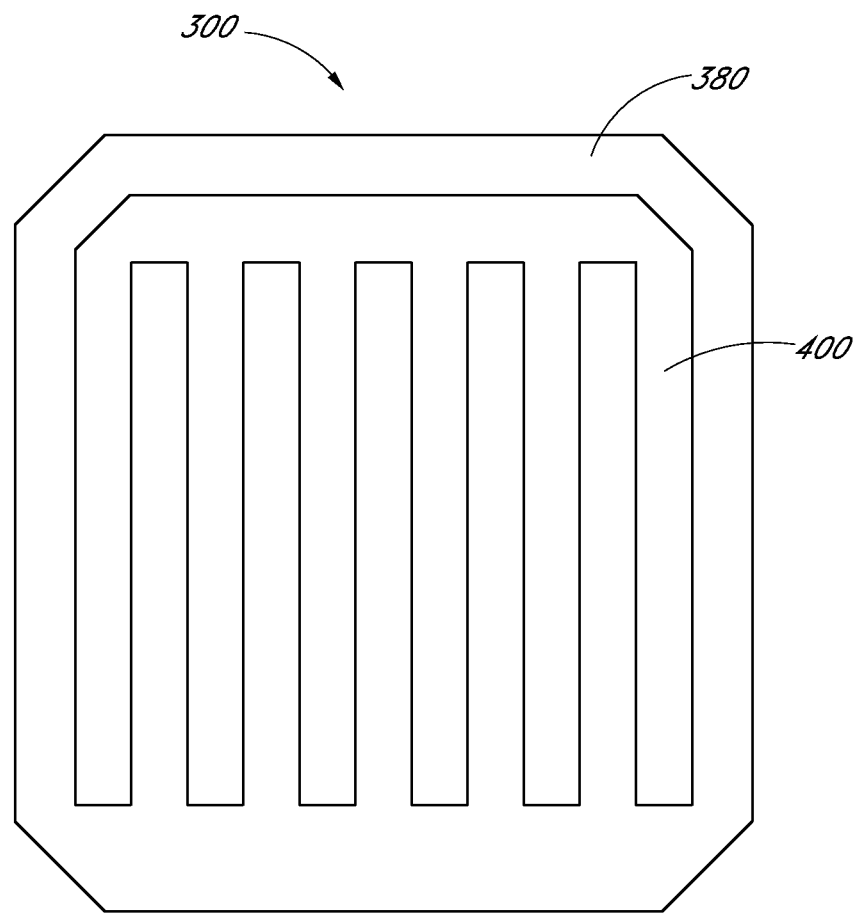
Figure 28:
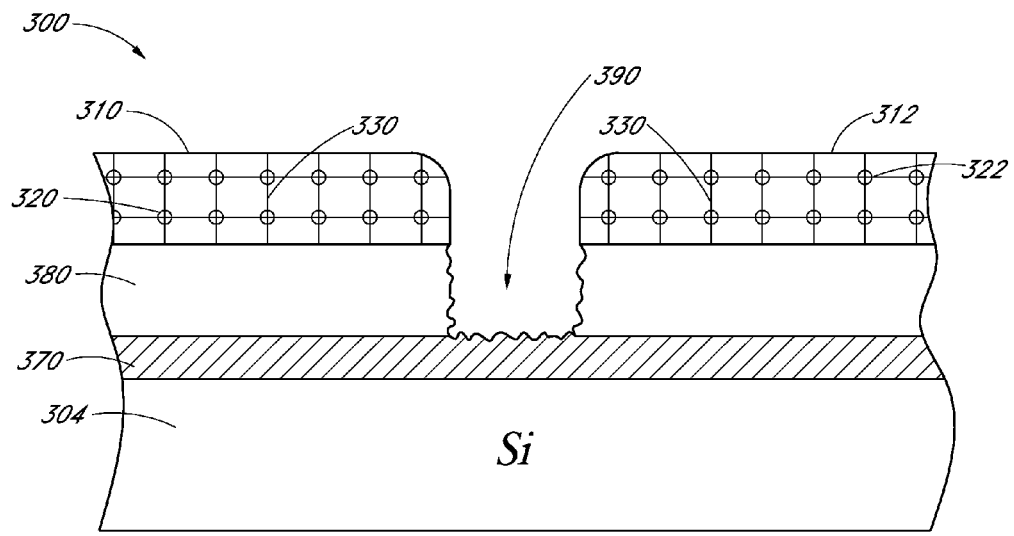
Figure 29:
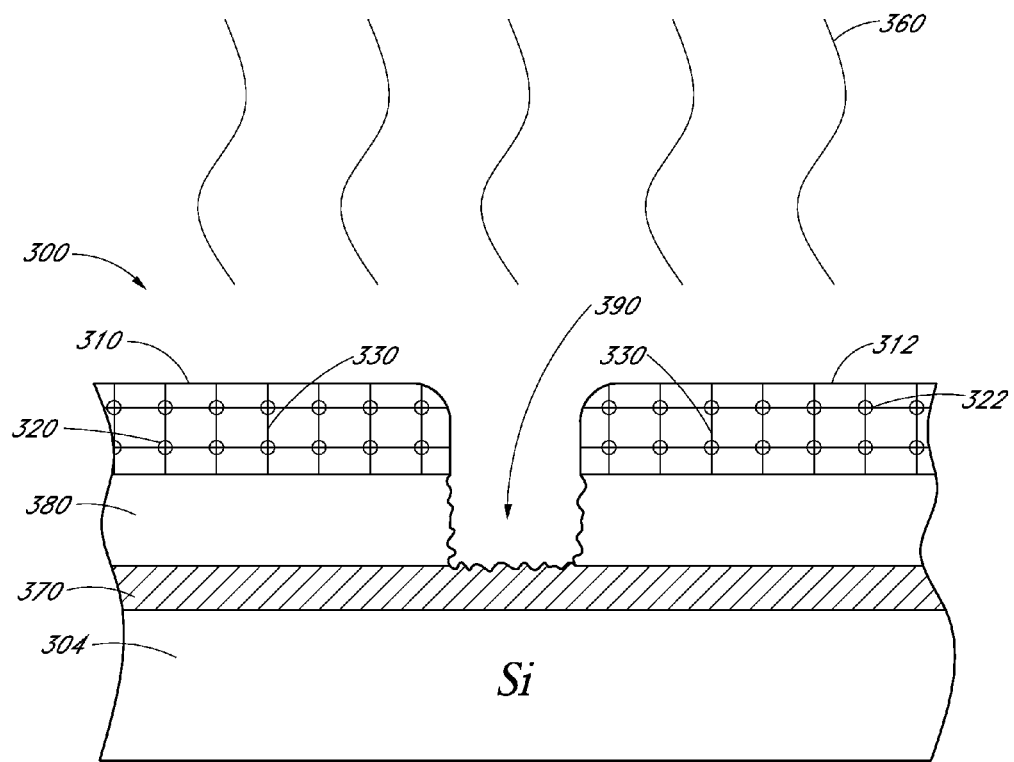
Figure 30:
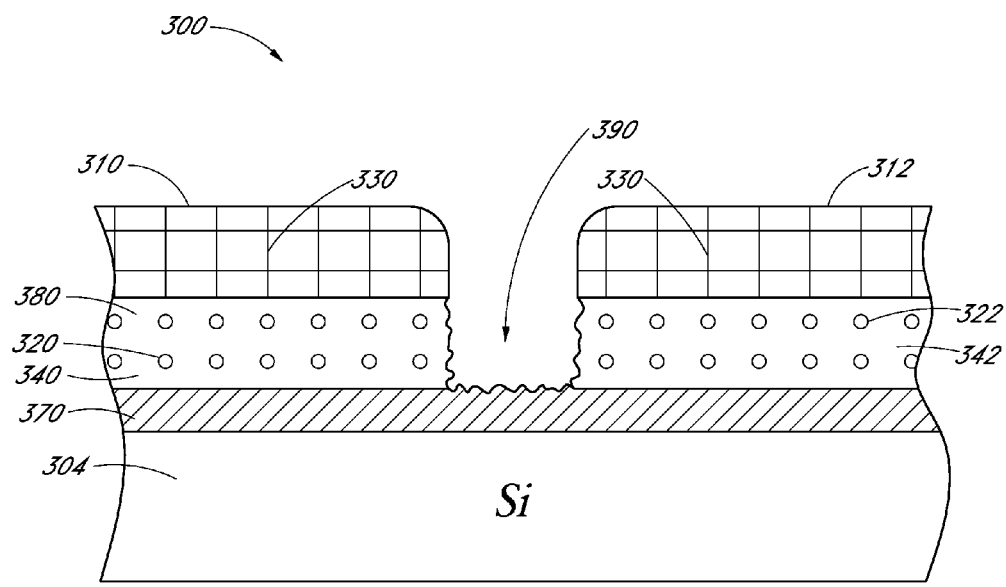

FIG. 27 illustrates an alternative embodiment of solar cell 300, wherein the etch-resistant dopant material 310, 312 may be dispensed in an arrangement of interdigitated contact fingers 400 on the polysilicon layer 380. In other embodiments, the interdigitated contact fingers 400 can be formed directly atop the silicon substrate 304, while in still others, the interdigitated contact fingers 400 can be formed atop a dielectric layer or other solar cell structure formed on the substrate 304.

FIGS. 28 to 31 illustrate an alternative embodiment of the solar cell 300, wherein the step of etching the polysilicon layer 380 using the etch-resistant dopant material 310, 312 as an etch-mask is performed following formation of the cross-linked matrix 330. This step can be followed by the thermal heating 360 of the etch-resistant dopant material 310, 312 to diffuse the dopant source 320, 322 into the polysilicon layer 380. The polysilicon layer 380 can then be exposed to a selective etchant to remove the etch-resistant dopant material 310, 312 without etching the polysilicon layer 380 as seen in FIG. 26. In another embodiment, the polysilicon layer 380 can be exposed to an etchant to remove the etch-resistant dopant material 310, 312 while also etching the polysilicon layer 380 resulting in an exposed region 390 that can form a potential barrier between the diffusion regions 340, 342. The etch-resistant dopant material 310, 312 can be subsequently washed or etched from the polysilicon layer 380 resulting in the solar cell structure illustrated in the embodiment of FIG. 26.

Figure 31:
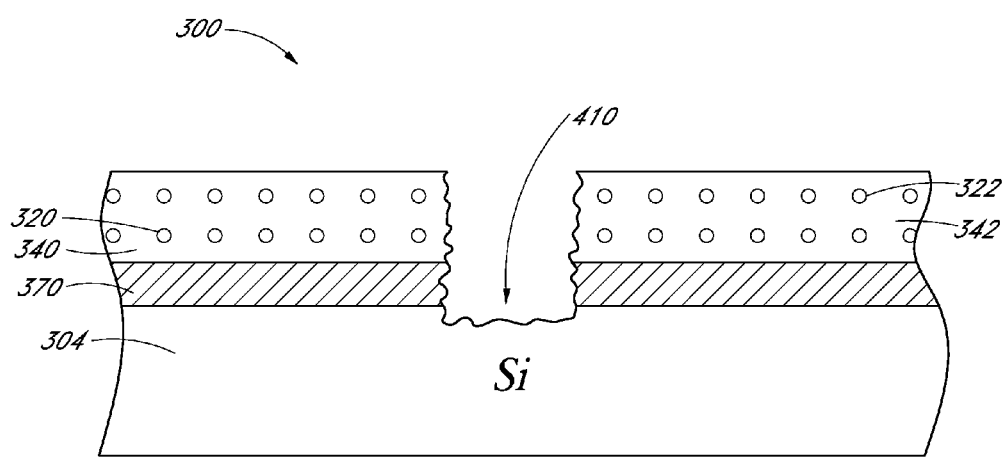

FIG. 31 illustrates another embodiment of a solar cell. In some embodiments of the solar cell fabrication, etching or washing of the etch-resistant dopant material 310, 312 (including use of an etchant selected for efficacy against the etch-resistant properties of the dopant material 310, 312), the etched-away exposed region 410 may etch through the dielectric layer and can reach and etch the silicon substrate 304, depending on the etchant and etchant concentration used. Thus, as illustrated in FIG. 31, in some embodiments, the exposed region 410 can extend through the dielectric layer 370. In certain embodiments, structural formation can occur in the exposed region 410, forming a randomly-textured pattern.

The step of etching any of the polysilicon layer 380, dielectric layer 370, or silicon substrate 304 during the fabrication process can be performed at any stage of the overall process after deposition of the etch-resistant dopant material 310, 312. Thus, the material itself can act as an etch mask. In some embodiments, the desired etch-resistant properties can be present prior to the non-thermal cure step, wherein the cross-linked matrix is formed. In other embodiments, the dopant material can act as an etch mask after solvent drive-out, after dopant drive into the dielectric layer, silicon substrate, or a polysilicon layer, after any number of other process steps, so long as it occurs prior to removal of the etch-resistant dopant material. Thus, the etch-resistant dopant material can serve as an mask for etching in any desired process step, contributing to the formation of any solar cell structure illustrated herein or manufacturable using the techniques described.

In some embodiments, however, the etch-resistant dopant material 310, 312 need not be used as an etching mask at all. The etch-resistant dopant material can be used solely as a dopant source and thereafter removed from the solar cell structure without performing a role in etching other features. In some embodiments, the dopant material, etch-resistant or not, can remain on the solar cell and incorporated into the emitter or contact structure.

It should be appreciated that the various tasks performed in connection with the solar cell manufacturing process can include any number of additional or alternative tasks. The tasks shown in FIG. 1-31 need not be performed in the illustrated order, and additional steps may be incorporated into a more comprehensive procedure or process having additional functionality not described in detail herein.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing solar cells, the method comprising:
    forming a thin dielectric layer on a surface of a silicon substrate;

forming a polysilicon layer over the thin dielectric layer;

depositing, in liquid phase, an etch-resistant dopant material comprising a dopant source material and a solvent on the polysilicon layer;

forming a cross-linked matrix in the etch-resistant dopant material using a non-thermal cure of the etch-resistant dopant material, the cross-linked matrix having a structure, and the non-thermal cure causing a phase change of the etch-resistant dopant material from liquid to solid; subsequently, removing the solvent from the etch-resistant dopant material without altering the structure of the cross-linked matrix; and heating the etch-resistant dopant material to a temperature wherein the dopant source material diffuses into the polysilicon layer.

2. The method of claim 1, further comprising the step of etching the polysilicon layer using the etch-resistant dopant material as an etchmask.

3. The method of claim 1, wherein depositing the etch-resistant dopant material comprises dispensing the etch-resistant dopant material in a plurality of interdigitated contact fingers on the silicon substrate.

4. A method of manufacturing solar cells, the method comprising:

depositing, in a liquid phase, an etch-resistant dopant material on a polysilicon layer disposed on a thin dielectric layer disposed on a silicon substrate, the etch-resistant dopant material comprising a dopant source and a solvent;

forming a cross-linked matrix in the etch-resistant dopant material using a non-thermal cure of the etch-resistant dopant material, the cross-linked matrix having a structure, and the non-thermal cure causing a phase change of the etch-resistant dopant material from liquid to solid; subsequently, removing the solvent from the etch-resistant dopant material without altering the structure of the cross-linked matrix; and heating the polysilicon layer and the etch-resistant dopant material having the cross-linked matrix to a temperature sufficient to cause the dopant source to diffuse into the polysilicon layer.

5. The method of claim 4, wherein forming the cross-linked matrix in the etch-resistant dopant material using the non-thermal cure of the etch-resistant dopant material comprises exposing the etch-resistant dopant material to non-infrared electromagnetic radiation.

6. The method of claim 5, wherein exposing the etch-resistant dopant material to the non-infrared electromagnetic radiation comprises exposing the etch-resistant dopant material to ultraviolet light.

7. The method of claim 5, wherein exposing the etch-resistant dopant material to the non-infrared electromagnetic radiation comprises exposing the etch-resistant dopant material with light from the visible spectrum or electromagnetic radiation having a wavelength of 380 to 760 nanometers.

8. The method of claim 4, wherein forming the cross-linked matrix in the etch-resistant dopant material using the non-thermal cure of the etch-resistant dopant material comprises transmitting acoustic waves toward the etch-resistant dopant material.

9. The method of claim 4, wherein depositing the etch-resistant dopant material comprises dispensing the etch-resistant dopant on the polysilicon layer.

10. The method of claim 9, wherein dispensing the etch-resistant dopant material comprises screen printing the etch-resistant dopant material onto the polysilicon layer.

11. The method of claim 9, wherein dispensing the etch-resistant dopant material comprises ink-jet printing the etch-resistant dopant material onto the polysilicon layer.

12. The method of claim 9, wherein dispensing the etch-resistant dopant material comprises spin coating the etch-resistant dopant material onto the polysilicon layer.

13. The method of claim 9, wherein dispensing the etch-resistant dopant material comprising the dopant source onto the polysilicon layer comprises dispensing a dopant material comprising a single-polarity dopant source onto the polysilicon layer.

14. The method of claim 13, wherein dispensing the dopant material comprising the single-polarity dopant source onto the polysilicon layer comprises dispensing a positive-type dopant onto the polysilicon layer.

15. The method of claim 13, wherein dispensing the dopant material comprising the single-polarity dopant source onto the polysilicon layer comprises dispensing a negative-type dopant onto the polysilicon layer.

16. The method of claim 4, wherein removing the solvent from the etch-resistant dopant material comprises heating the etch-resistant dopant material to at least 400° Celsius.

17. A method of manufacturing solar cells, the method comprising:

depositing, in a liquid phase, a dopant material on a polysilicon layer disposed on a thin dielectric layer disposed on a silicon substrate having a photovoltaic solar cell structure, the dopant material comprising a dopant and a solvent;

forming a cross-linked matrix in the dopant material using a non-thermal exposure of the dopant material to ultraviolet light through a photo-polymerization process, the cross-linked matrix having a structure, and the photo-polymerization process causing a phase change of the dopant material from liquid to solid; subsequently, removing the solvent from the dopant material without altering the structure of the cross-linked matrix; and heating the polysilicon layer and the dopant material having the cross-linked matrix to a temperature sufficient to cause the dopant to diffuse into the polysilicon layer.

18. The method of claim 17, wherein forming the cross-linked matrix in the dopant material using the non-thermal exposure of the dopant material to the ultraviolet light comprises exposing the dopant material to electromagnetic radiation having a wavelength of 8 to 400 nanometers.

19. The method of claim 17, wherein depositing the dopant material comprises depositing a chemical group comprising a chemical structure selected from the group comprising silanes, cyclosilanes, and siloxanes.

* * * * *